(12) United States Patent
Bach et al.

(10) Patent No.: US 7,491,925 B2
(45) Date of Patent: Feb. 17, 2009

(54) PHOTODETECTOR COMPRISING A MONOLITHICALLY INTEGRATED TRANSIMPEDANCE AMPLIFIER AND EVALUATION ELECTRONICS, AND PRODUCTION METHOD

(75) Inventors: Konrad Bach, Tieftal (DE); Alexander Hoelke, Erfurt (DE); Uwe Eckoldt, Hohenfelden (DE); Wolfgang Einbrodt, Eisenach (DE); Karl-Ulrich Stahl, Erfurt (DE)

(73) Assignees: X-FAB Semiconductor Foundries, AG, Erfurt (DE); Melexis GmbH, Erfurt (DE)

( * ) Notice: Subject to any disclaimer, the term of this patent is extended or adjusted under 35 U.S.C. 154(b) by 0 days.

(21) Appl. No.: 10/596,035

(22) PCT Filed: Dec. 6, 2004

(86) PCT No.: PCT/DE2004/002672

§ 371 (c)(1),
(2), (4) Date: Mar. 20, 2007

(87) PCT Pub. No.: WO2005/057667

PCT Pub. Date: Jun. 23, 2005

(65) Prior Publication Data

US 2007/0164393 A1 Jul. 19, 2007

(30) Foreign Application Priority Data

Dec. 6, 2003 (DE) ................................ 103 57 135

(51) Int. Cl.
*H03F 3/08* (2006.01)

(52) U.S. Cl. ................................ 250/214 A; 250/214.1; 257/459; 257/466; 330/308

(58) Field of Classification Search ............. 250/214 A, 250/214.1, 214 R, 239; 257/459, 466, 225–234, 257/290–294, E33.077; 330/308; 369/134
See application file for complete search history.

(56) References Cited

U.S. PATENT DOCUMENTS 4,314,152 A * 2/1982 Fenk ....................... 250/214 A (Continued)

FOREIGN PATENT DOCUMENTS

DE 19838442 8/1998

(Continued)

OTHER PUBLICATIONS

Kyomasu M., "Development Of An Integrated High Speed Silicon Pin Photodiode Sensor", IEEE Transactions On Electron Devices, NY, US, Jun. 1995.

(Continued)

*Primary Examiner*—Stephen Yam
(74) *Attorney, Agent, or Firm*—Duane Morris LLP

(57) ABSTRACT

The aim of the invention is to configure a photodetector (10) such that no disadvantages are created for processing low luminous intensities on detectors known in prior art, especially when monolithically integrating the evaluation electronics. Said aim is achieved by a photodetector for processing low luminous intensities, comprising a monolithically integrated transimpedance amplifier and monolithically integrated evaluation electronics. An actual photocell component (20) is assigned to the chip face onto which the light preferably falls. Electronic circuit components (30) are arranged on the opposite chip face. Electrical connections (40) between the photocell and the electronic circuit are provided with an extension in the direction running perpendicular to the chip normal.

22 Claims, 4 Drawing Sheets

U.S. PATENT DOCUMENTS

| | | |
|---|---|---|
| 5,008,541 A | 4/1991 | Audaire et al. |
| 5,365,088 A * | 11/1994 | Myrosznyk ................. 257/186 |
| 6,188,089 B1 * | 2/2001 | Spartiotis .................... 257/188 |
| 6,323,475 B1 * | 11/2001 | Spartiotis et al. ......... 250/208.1 |
| 6,919,609 B2 * | 7/2005 | Lindemann et al. ......... 257/443 |
| 7,189,971 B2 * | 3/2007 | Spartiotis et al. ....... 250/370.09 |
| 2003/0015767 A1 | 1/2003 | Emrick et al. |
| 2003/0122210 A1 | 7/2003 | Cohen et al. |
| 2004/0097021 A1 | 5/2004 | Augusto et al. |

FOREIGN PATENT DOCUMENTS

| | | |
|---|---|---|
| GB | 2322 736 | 9/1998 |
| WO | WO03/100871 | 12/2003 |

OTHER PUBLICATIONS

Hobenbild M. et al., "High-Speed Photodiodes With Reduced Dark Current And Enhanced Responsivity In The Blue/uv Spectra".

* cited by examiner

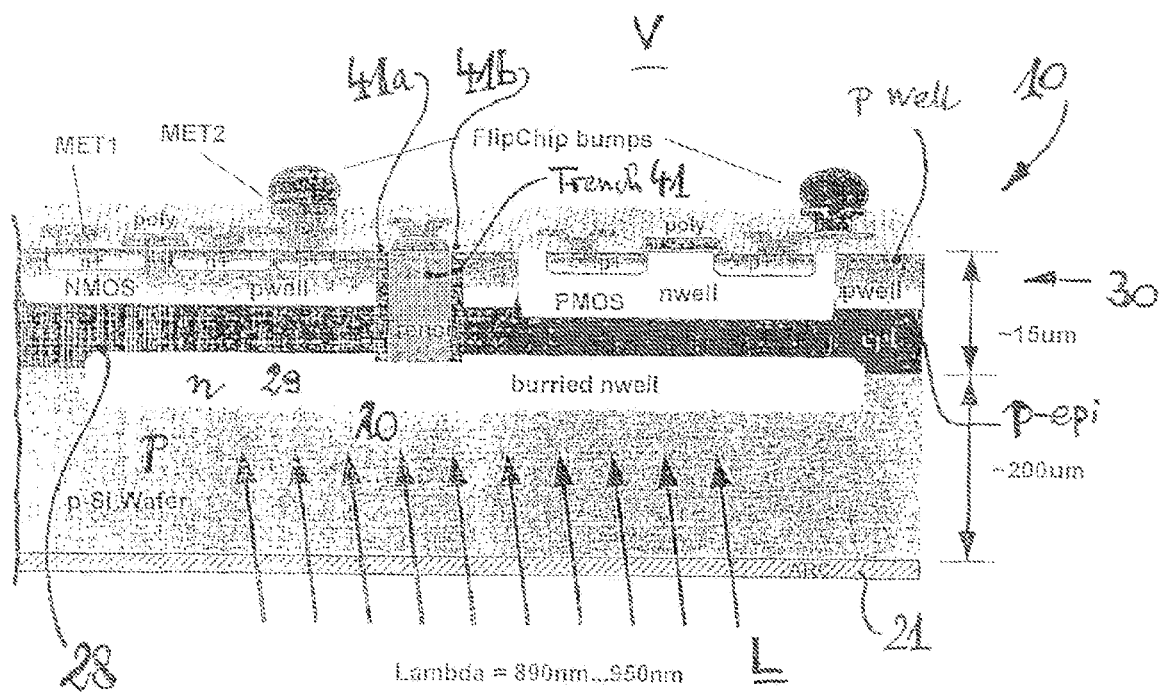

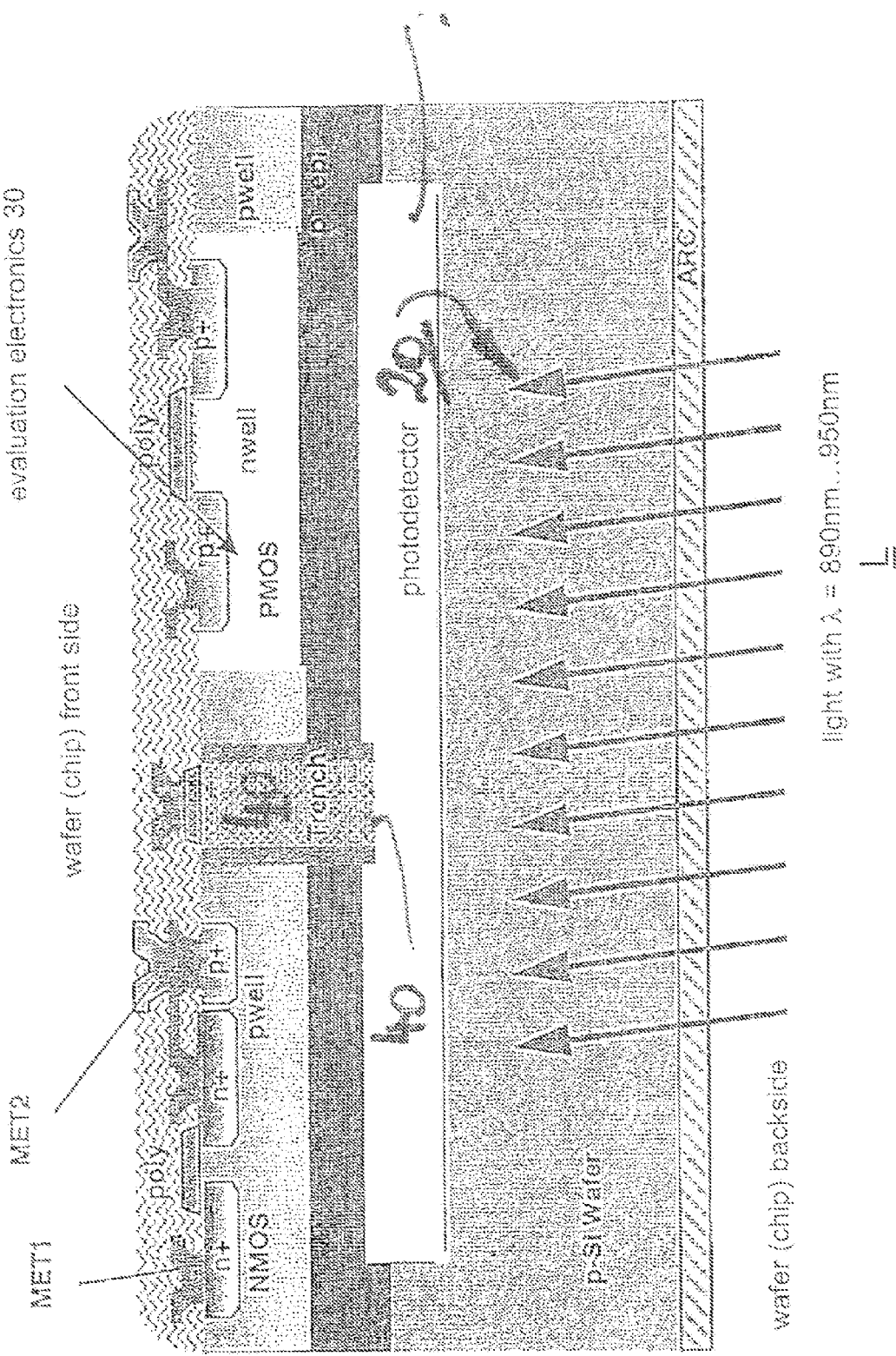

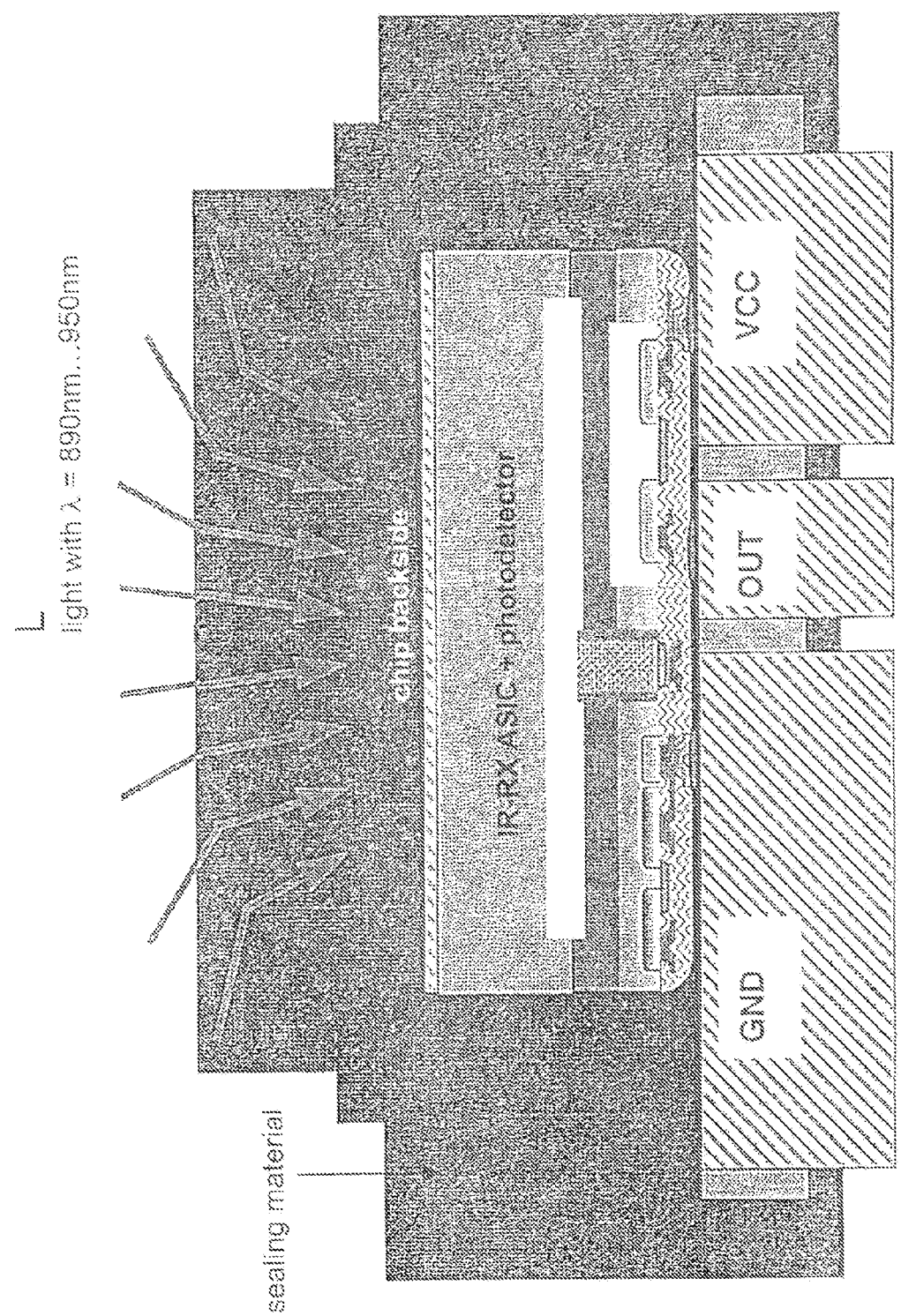

PHOTODETECTOR COMPRISING A MONOLITHICALLY INTEGRATED TRANSIMPEDANCE AMPLIFIER AND EVALUATION ELECTRONICS, AND PRODUCTION METHOD

BACKGROUND OF THE INVENTION

The structure of a photodetector for low luminous intensities to be processed is described, in which the photo sensitive element (photocell), a transimpedance amplifier and corresponding evaluation electronic are commonly integrated in monolithic manner, wherein a vertical arrangement of the photo sensitive element and the electronic circuitry is suggested. This offers the advantage of increasing the sensitivity of the photodetector and of saving chip area (single chip solution). When mounting the photodetector cost savings may be achieved, since the chip package may be designed smaller and less complex.

BRIEF SUMMARY OF THE INVENTION

In photo electric systems, such as opto-couplers, infrared receivers circuitry for IR remote controls, image sensors or CD/DVD photodetector ICs, various technological concepts for realization exist due to the very different requirements with respect to the "light to voltage conversion". It may be distinguished between fully integrated circuits, in which the detector (mostly a photo diode) and the associated electronic are side by side combined in the chip, and two-chip approaches, in which the detector as a separate chip is connected with the amplifying and evaluating electronics via a bond wire.

Fully integrated solutions allow, among others, an immediate signal processing and thus are specifically suited for high operating speeds/data rates (e.g., CD/DVD PDICs—PDICs are photodetector integrated circuits). Fully integrated systems are unavoidable when a plurality of optical signals are to be detected concurrently in a spatially very restricted neighbourhood (for example, scanner lines, image sensors, measurement tasks).

For applications involving low luminous intensities to be processed large detector areas are necessary. These large areas may not commonly be integrated with the signal processing circuit portions on a reasonable economic basis. The reason for this resides in the fact that due to the integrated amplifier and evaluation electronics complex and thus expensive manufacturing processes (CMOS, BiCMOS) are used. In this way for the technologically less sophisticated large detector area (e.g., photo diode area) the same high costs caused by technology would occur. For this reason semiconductor technologies are used for the different chips in the presently existing two-chip solutions for low luminous intensities, which are optimally adapted to the requirements. However, in this way also additional cost for mounting, an increased requirement for space and thus larger packages are necessary. However, due to the electric connection of the detector chip and the signal processing IC via a bond connection an increased exposure to electromagnetic interfering radiation may occur. This especially holds true for conventional IR receiver modules for infrared remote controls, which are installed in TV devices in the vicinity of cathode ray tubes or LC displays. This may only be compensated for by complex and thus expensive packages, cf., data sheet Sharp, attachment GP1UE26RK.pdf.

It is an object of the present invention to provide a photodetector that the disadvantages described above in view of detectors for low illumination powers to be processed according to the prior art may be overcome with respect to the monolithic integration of the evaluation electronic.

The object is solved by the features recited in claims 1, 7 or 10.

The subject-matter of claim 1 provides the advantage that the photo sensitive area of the detector may extend substantially across the entire area that corresponds to the chip area, and this area may also be used for the integration of the amplifier circuit and/or the further signal processing. The technological effort for the manufacturing is hereby slightly increased due to the vertical connection of the photo diode portion with the integrated circuit via vertically extending (parallel with respect to the normal direction of the chip) doped channels, for instance, via a modified isolation trench; the required area and other costs caused thereby for the overall system are, however, reduced in an over proportional manner. Moreover, due to the compact configuration parametric advantages are obtained compared to conventional two-chip approaches.

Advantageous embodiments of the subject-matter of claim 1 are described in the dependent claims.

In this respect a trench is particularly advantageous that is used, based on its design, as an electric connection between the photo cell and the electronic circuit.

BRIEF DESCRIPTION OF THE SEVERAL VIEWS OF THE DRAWING

The invention will be explained in more detail by illustrative embodiments. The figures are self-explaining and thus only require a short more detailed discussion.

FIG. 1 is a schematic view of a first example of the vertical configuration of photocells 20 and electronic circuits 30 according to the present invention, which are electrically connected 40 by a modified trench, wherein the entire arrangement is monolithically integrated.

FIG. 1a is a schematic representation of another embodiment of the vertical configuration of photocells and electronic circuits according to the present invention, which are electrically connected by a modified trench in a monolithic manner.

FIG. 2a is another schematic representation of a vertical integrated detector system in a package, wherein the enclosing sealing material is transparent for light having the signal wavelength.

DETAILED DESCRIPTION OF THE INVENTION

Figure 2:
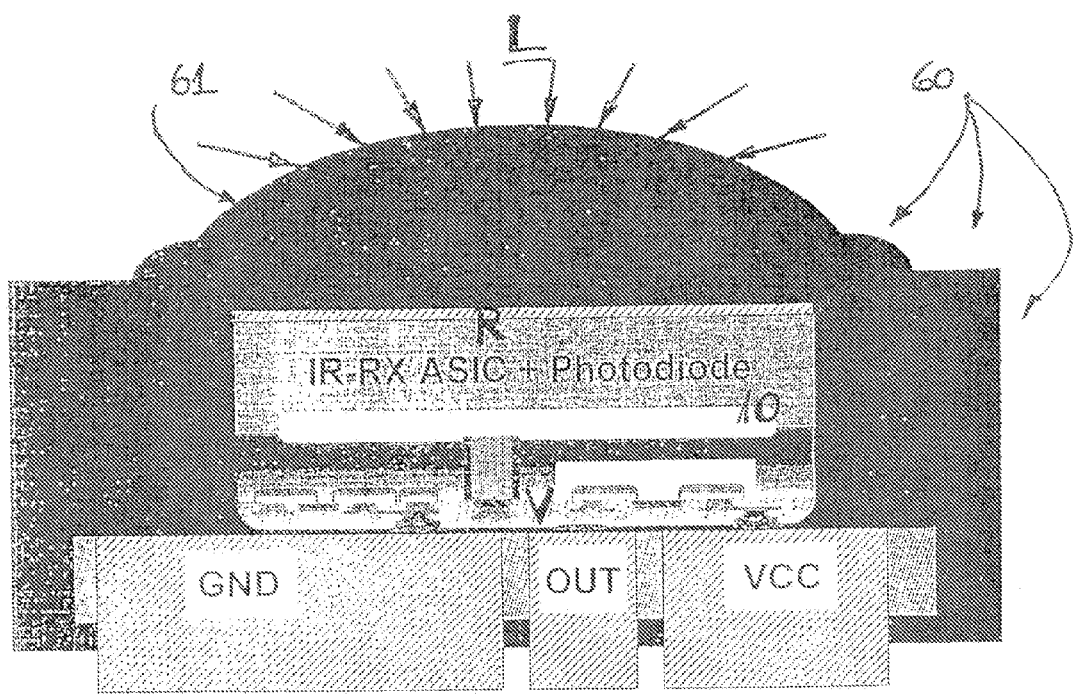
FIG. 2 is a schematic representation of a vertical integrated detector system in a package 60, wherein the enclosing sealing material 61 is transparent for light having the signal wavelength.

For manufacturing a monolithic photodetector 10 the following process flow may be used:

The starting material for all embodiments is a high-ohmic silicon wafer (100 . . . 1000 Ohm*cm), for instance, p-conductive. A masked (mask defined) counter-doping process, for instance based on phosphorous ions, is performed into the wafer from one wafer surface V. The mask may expose substantially the entire subsequent chip size. Following an appropriate anneal process (that may be associated with an oxidation, the step of which will serve as an alignment tool) an epitaxial process including the same dopant conductivity type as included in the initial wafer is then be performed on the non-opposing wafer surface V at a higher dopant concentration (5 . . . 50 Ohm*cm) and with a thickness in the range of 10 . . . 25 µm.

By means of this epitaxial layer 28 local dopants for contacting the now buried counter-doped layer 29 are introduced, which forms the substantial portion of the photocell. This may be accomplished by a well-known Sinker diffusion.

In the example shown the dopant concentration is generted by etching deep isolation trenches 41 down into the buried layer 29 and subsequently doping the sidewalls 41a, 41b by a specifically tilted implantation process. Subsequently, the opening is filled with polysilicon.

Alternatively, the isolation trenches may be filled with doped polysilicon and the preciously described implantation of the sidewalls may be omitted.

Once the isolation trenches are closed and planarized, a standard CMOS or BiCMOS process is performed on the basis of this epitaxially grown wafer side. The actually buried photocell 20 is connected with the circuit 30 at the surface by means of the isolation trenches 41 or in the other example by means of the isolation trenches 40.

The layout of the circuit 30 is designed such that the contact regions 41 or 40 of the buried photocell (e.g. a diode) are immediately involved in order to realise very short conductive paths. Electric connections (40) between the photocell and the electronic circuit are provided with an extension in a direction along a perpendicular direction with respect to the chip plane (the normal direction).

After completion of the conventional semiconductor manufacturing process the entire semiconductor wafer is thinned at the side R facing away from the electronic circuit and optionally an antireflective coating (ARC) 21 is deposited on the backside R of the wafer. The chip provided after the dicing of the chip is then mounted upside down (that is, the circuit 30 facing downwardly) on a printed board (flip chip technique), such that the photocell 20 has its front side facing upwardly to be accessible. The flip chip technique is advantageous in view of an optimal utilization of the vertical integration of the detector and the circuit.

Alternatively, the chip may be formed in a conventional manner within a "clear mold package" according to a "chip on lead" technique by bond connections for the supply voltage and the output signal. In this case illumination is possible from the one side (electronic side) or the other side (detector side).

In this way the photodetector provided for processing low luminous intensities comprises monolithically integrated transimpedance amplifiers and evaluation electronics. An actual photocell portion is assigned to the one chip side. The light is preferably received from this side. Electronic circuits are provided on the opposing chip side. Electric connections are provided between the photocell and the electronic circuit (s) and have an extension along the direction perpendicular with respect to the chip plane.

The photo detection of the incident light is performed such that the light impinges onto the backside or the front side and generates, depending on the wavelength, electron/hole pairs within the first 10 µm to 20 µm.

These electron/hole pairs diffuse into the space charge region of the buried diode and generate there a photo voltage or a photo current, depending on the circuit configuration, the signal of which may be evaluated and processed by the overlying CMOS or BiCMOS circuit 30, which are here provided as a monolithically integrated transimpedance amplifier and an evaluation electronics.

The electric connections between the photocell portion and the electronic circuit are formed by specifically filled trenches that are doped in certain areas, wherein the specifically filled trenches comprise doped sidewalls that establish the electric connection between the photocell and the electronic circuit.

The specifically filled trenches may be filled with doped polysilicon, which provides the electric connection between the photocell and the electronic circuit, wherein the specifically filled trenches may also be used for the electrically non-conductive separation (insulation) of different chip areas.

List of Reference Signs
10 monolithically integrated (single crystalline) photodetector
20 photocell portion
30 electronic circuit portions
40 electric connections
41 conductive isolation trenches
60 package
61 sealing compound Legend to Figures:
  FIG. 1a
  20 photodetector
  30 evaluation electronics
  wafer (chip) front side
  wafer (chip) backside
  light with λ=890 nm . . . 950 nm
  FIG. 2a
  light with λ=890 nm . . . 950 nm
  chip backside
  sealing material
  photodetector
  We claim:

1. A photodetector for processing low luminous intensities comprising a monolithically integrated transimpedance amplifier and evaluation electronics, the photodetector having two opposite chip sides, and light (L) being incident from one of the chip sides, the photodetector further comprising
  a photocell portion (20) associated with one of the chip sides;
  an electronic circuit portion (30) formed on the other of the chip sides, opposite said photocell portion (20);
  electric connections between said photocell portion (20) and the electronic circuit portion (30), said electric connections extending in a direction parallel to an axis, said axis being orthogonal as a chip normal with respect to a chip plane, said chip plane being parallel to each of the opposite chip sides;
  wherein said electric connections between said photocell portion (20) and said electronic circuit portion (30) are formed by filled trenches doped in specified areas that are extending in a crystalline semiconductor.

2. The photodetector of claim 1, wherein said filled trenches comprise conductively doped sidewalls forming electric connections between said photocell portion (20) and said electronic circuit portion (30).

3. The photodetector of claim 2, wherein the filled trenches extend entirely through the crystalline semiconductor.

4. The photodetector of claim 1, the light being incident from the side associated with the photocell portion (20).

5. A photodetector for processing low luminous intensities comprising a monolithically integrated transimpedance amplifier and evaluation electronics, the photodetector having two opposed chip sides, and further comprising
  a photocell portion (20) associated with one of the chip sides;
  an electronic circuit portion (30) formed on the other of the chip sides, opposite said photo cell portion (20);
  electric connections between said photocell portion (20) and the electronic circuit portion (30), said electric connections extending in a direction parallel to an axis, said axis being orthogonal as a chip normal with respect to a chip plane, said chip plane being parallel to each of the chip sides;

wherein filled trenches are provided and filled with a doped polysilicon for establishing said electric connections between said photocell portion (20) and said electronic circuit portion (30) and light (L) being incident from one of the chip sides.

6. The photodetector of claim 1, wherein said filled trenches are also used for an electrically non-conductive isolation of different chip areas.

7. The photodetector of claim 1, said photodetector being formed by a CMOS or BiCMOS process.

8. A method for forming a photodetector according to claim 1 for processing low luminous intensities, said photodetector comprising a monolithically integrated transimpedance amplifier and evaluation electronics (30), the method comprising the steps of:

using high-ohmic silicon of a first conductivity type in a wafer as an initial material, the wafer having two sides;

forming an area of inverse conductivity type by counter-doping using on a mask and subsequently annealing a wafer side receiving the evaluation electronics (30);

performing an epitaxy process and forming a layer having a thickness of substantially 10 to 25 µm, the first conductivity type of the initial material having a doping in a range of 5 to 50 Ohm*cm on one of the wafer sides, as a first wafer side;

contacting the counter-doped layer, being buried, by locally providing a doping of the epitaxy layer by one of a Sinker diffusion and filled trenches comprising doped areas;

planarizing at least said filled trenches of the surface of the wafer side including said epitaxy layer;

performing one of a CMOS and BiCMOS process for forming the integrated electronic circuit (30) on the first wafer side;

thinning the wafer at the other of the two wafer sides as second side.

9. The method of claim 8, for forming the photodetector, wherein after a separating, separated chips are mounted with said one side as detector side on a COL as chip on lead carrier strip, and said mounted chips are electrically connected by bond wires.

10. The method of claim 8, comprising the steps of separating and mounting the separated chips and sealing the mounted chips with a sealing material that is optically transparent in a sensitive range of said photodetector.

11. Method of claim 8, including a forming of an antireflective coating above said one wafer side.

12. The method of claim 8 for forming the photodetector, wherein after a separating at least one of the separated chips is mounted with the side of the electronic circuit on a printed board or a lead frame or a chip carrier strip;

sealing the mounted chip with a sealing material (61) that is optically transparent in a sensitivity range of said photodetector.

13. A photodetector for processing low luminous intensities comprising monolithically integrated transimpedance amplifiers and evaluation electronics as photocell portion and evaluation electronics, formed in a common single crystalline semiconductor material as chip the photocell portion being buried and an overlying electronic circuit portions being associated with a chip front side of the chip;

electric connections provided as trenches (40, 41) between said buried photocell portion and the electronic circuit portion, said electric connections extending in a direction of a chip normal or parallel with said chip normal;

wherein light to be detected is received from a backside of the chip.

14. The monolithic photodetector of claim 13, wherein said chip back side is configured for receiving said light to be detected.

15. The monolithic photodetector of claim 13, wherein said electric connections between said photocell portion and said electronic circuit are formed by filled trenches doped in specified areas that are entirely extending within said crystalline semiconductor material.

16. The monolithic photodetector of claim 13, wherein said filled trenches extend entirely within said single crystalline semiconductor material and comprise sidewalls (41a, 41b) that are doped along an entire length so as to be conductive along the entire length, and form electric connections between said photocell portion and said electronic circuit portions.

17. The monolithic photodetector of claim 13, wherein said filled trenches (41) are filled with doped polysilicon for establishing said electric connections between said photocell and said electronic circuit portions.

18. The monolithic photodetector of claim 13, wherein said filled trenches provide for an electrically non-conductive isolation of different chip areas of the chip.

19. The monolithic photodetector of claim 13, wherein said photodetector is formed by a CMOS or BiCMOS process.

20. A method for forming a photodetector according to claim 1 for processing low luminous intensities, said photodetector comprising a monolithically integrated transimpedance amplifier and evaluation electronics in a semiconductor wafer, the method having the following manufacturing steps of:

1) using high-ohmic silicon of 100 to 1000 Ohm*cm of a first conductivity type, 2) forming an area of inverse conductivity type by counter-doping based on a mask by ion implantation, and subsequently annealing the wafer front side for carrying the evaluation electronics in a later stage;

3) performing an epitaxy process for forming a layer having a thickness of 10 to 25 µm and the first conductivity type of the initial material having a doping in a range of 5 to 50 Ohm*cm at a wafer front side, A1) contacting the counter-doped mask defined layer now being buried by filled trenches, A2) planarizing said filled trenches of the wafer front side, 4) performing one of a standard CMOS and BiCMOS process for forming an integrated electronic circuit on the wafer front side, 5) thinning the semiconductor wafer from a wafer backside, 6) separating the chips, and mounting the separated chips on a printed board or a lead frame or a chip carrier strip, said wafer front side carrying said electronic circuit facing downwardly, and sealing said chip with a sealing material that is optically transparent in a sensitivity range of said photodetector.

21. The method of claim 20, wherein a sequence of steps is the sequence of claim 20 as steps 1) to 6).

22. The method of claim 20, wherein the steps A1) and the subsequent step A2) are always performed after step 3) or alternatively after step 4) or within the process of step 4).

* * * * *